(12) United States Patent
Shimizu

(10) Patent No.: US 11,929,569 B2
(45) Date of Patent: Mar. 12, 2024

(54) CIRCUIT BOARD, METHOD FOR PRODUCING CIRCUIT BOARD, AND IMAGING APPARATUS

(71) Applicant: RICOH COMPANY, LTD., Tokyo (JP)

(72) Inventor: Takayoshi Shimizu, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 430 days.

(21) Appl. No.: 17/289,107

(22) PCT Filed: Nov. 19, 2019

(86) PCT No.: PCT/JP2019/045272
§ 371 (c)(1),
(2) Date: Apr. 27, 2021

(87) PCT Pub. No.: WO2020/110828
PCT Pub. Date: Jun. 4, 2020

(65) Prior Publication Data
US 2021/0328373 A1    Oct. 21, 2021

(30) Foreign Application Priority Data

Nov. 30, 2018   (JP) .................... 2018-225441

(51) Int. Cl.
*H01R 12/79*     (2011.01)
*H01R 12/77*     (2011.01)
(Continued)

(52) U.S. Cl.
CPC .......... *H01R 12/79* (2013.01); *H01R 12/771* (2013.01); *H05K 1/118* (2013.01); *H05K 3/005* (2013.01)

(58) Field of Classification Search
CPC ...... H01R 12/79; H01R 12/771; H05K 1/118; H05K 3/005; H05K 3/0052;
(Continued)

(56) References Cited

U.S. PATENT DOCUMENTS 7,819,696 B2 * 10/2010 Wu ................. H01R 12/592
439/71
2005/0194693 A1   9/2005 Saimen
(Continued)

FOREIGN PATENT DOCUMENTS

| JP | S56-043181 U | 4/1981 |
| JP | S56-089182 U | 7/1981 |

(Continued)

OTHER PUBLICATIONS

Office Action dated Sep. 27, 2022 in Japanese Patent Application No. 2018-225441, 5 pages.
(Continued)

*Primary Examiner* — Briggitte R. Hammond
(74) *Attorney, Agent, or Firm* — XSENSUS LLP

(57) ABSTRACT

A circuit board includes a board body and pair of connection portions disposed at both ends of the board body. Each of the pair of connection portions is inserted into a connector. Each of the pair of connection portions includes a connection terminal electrically connected to the connector, and at least one of the pair of connection portions includes an extending portion extending from the connection terminal to an insertion leading end of the at least one of the pair of connection portion. The extending portion is disposed at a position to avoid a virtual line extending in an insertion direction through a position where the connector and the connection terminal are electrically connected.

5 Claims, 13 Drawing Sheets

(51) Int. Cl.
*H05K 1/11* (2006.01)
*H05K 3/00* (2006.01)

(58) Field of Classification Search
CPC ... H05K 2201/0373; H05K 2201/0382; H05K 2201/09154; H05K 2201/09181; H05K 2201/09381; H05K 2201/094; H05K 2201/09427; H05K 2201/09727; H05K 2201/10189; H05K 2203/0108
See application file for complete search history.

(56) References Cited

U.S. PATENT DOCUMENTS

| | | |
|---|---|---|
| 2007/0099483 A1 | 5/2007 | Tsai |
| 2008/0090331 A1 | 4/2008 | Saimen |
| 2013/0344717 A1 | 12/2013 | Ito |

FOREIGN PATENT DOCUMENTS

| | | |
|---|---|---|
| JP | 2003-347699 A | 12/2003 |
| JP | 2005-150374 A | 6/2005 |
| JP | 2011-009408 A | 1/2011 |
| JP | 2012-178383 A | 9/2012 |
| WO | WO 2012/115282 A1 | 8/2012 |

OTHER PUBLICATIONS

International Search Report and Written Opinion dated Apr. 3, 2020 in PCT/JP2019/045272 filed on Nov. 19, 2019.

* cited by examiner

CIRCUIT BOARD, METHOD FOR PRODUCING CIRCUIT BOARD, AND IMAGING APPARATUS

TECHNICAL FIELD

Embodiments of the present disclosure relate to a circuit board, a method for producing the circuit board, and an imaging apparatus.

BACKGROUND ART

In general, to electrically connect boards to each other, for example, a circuit board, such as a flexible printed circuit (FPC) or a flexible flat cable (FFC), is used. The circuit board includes a connection portion configured to be inserted into a circuit connector to be electrically connected to the circuit connector. The connection portion is provided with a plurality of connection terminals that each include an exposed wiring pattern. Each of the connection terminals is subjected to, for example, electroplating, such as gold plating, to prevent rust, prevent generation of whiskers, reduce connection resistance, and improve connection reliability.

In electroplating, the connection terminals are required to be applied with a potential (voltage). Each connection terminal is thus provided with a plated lead including metal. As viewed in an insertion direction in which the connection portion is inserted into the connector, the plated lead extends from the connection terminal in the insertion direction, and an extending end of the plated lead reaches an insertion leading end of the connection portion.

Consequently, when the connection portion is inserted into the connector, the extending end of the plated lead including metal may come into contact with a portion (for example, a fragile portion) of the connector. In this case, the extending end of the plated lead may shave, depending on the size of an angle of insertion of the connection portion with respect to the connector, a portion of the connector and generate shavings.

CITATION LIST

Patent Literature

PTL 1: Japanese Patent Application Publication No. 2003-347699

SUMMARY OF INVENTION

Technical Problem

The generated shavings are pushed into an inner portion of the connector in response to an insertion motion of the connection portion and accumulate at a contact portion and the periphery thereof. Depending on the amount of the shavings that accumulate at the contact portion, electrical connection between the connection terminals and the contact portion may become poor. In this case, causing the electrical connection to be in a good state requires a technology that causes shavings not to easily accumulate at the contact portion.

An object of the present disclosure is to provide a technology that causes shavings not to easily accumulate at a contact portion to thereby suppress electrical connection between a connection terminal and a contact portion from becoming poor.

Solution to Problem

A circuit board includes a board body and pair of connection portions disposed at both ends of the board body. Each of the pair of connection portions is inserted into a connector. Each of the pair of connection portions includes a connection terminal electrically connected to the connector, and at least one of the pair of connection portions includes an extending portion extending from the connection terminal to an insertion leading end of the at least one of the pair of connection portion. The extending portion is disposed at a position to avoid a virtual line extending in an insertion direction through a position where the connector and the connection terminal are electrically connected.

Advantageous Effects of Invention

According to one aspect of the present disclosure, it is possible to provide a technology that causes shavings not to easily accumulate at a contact portion to thereby suppress electrical connection between a connection terminal and a contact portion from becoming poor.

BRIEF DESCRIPTION OF DRAWINGS

The accompanying drawings are intended to depict example embodiments of the present disclosure and should not be interpreted to limit the scope thereof. The accompanying drawings are not to be considered as drawn to scale unless explicitly noted. Also, identical or similar reference numerals designate identical or similar components throughout the several views.

DESCRIPTION OF EMBODIMENTS

Figure 1:
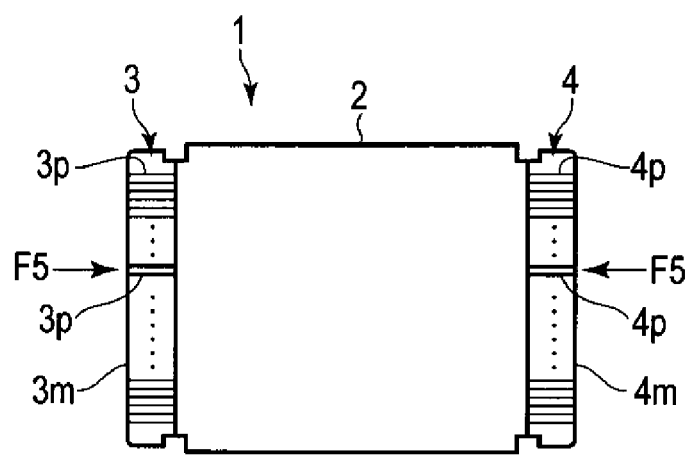
FIG. 1 is a plan view of a circuit board according to an embodiment of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

The circuit board is, for example, a flexible printed board (FPC), a flexible flat cable (FFC), a printed circuit board (PCB), or the like, and includes various types of circuit boards depending on an intended purpose and a use environment. In the present embodiment, as an example of the circuit board, an FPC is considered.

FIG. 1 is a plan view of an FPC 1. As illustrated in FIG. 1, the FPC 1 includes a board body 2 and two connection portions (a first connection portion 3 and a second connection portion 4) disposed at two ends of the board body 2. The board body 2 includes, as a base material, for example, a polyimide resin, a polyetherimide resin, a polyamide-imide resin, a polyamide resin, a polyester resin, or the like. Consequently, the FPC 1 (board body 2) that has flexibility is realized.

The first connection portion 3 is disposed at one end of the board body 2. The second connection portion 4 is disposed at another end of the board body 2. The first connection portion 3 and the second connection portion 4 are connected to each other via a connection wiring pattern formed at the board body 2. The connection wiring pattern is covered by a cover film layered at the board body 2.

The first connection portion 3 has a front surface on which a plurality of first connection terminals 3p that each include an exposed wiring pattern are disposed. The first connection terminals 3p each include a metal material that has conductivity. In the example in FIG. 1, the first connection terminals 3p each have a linear shape extending in a direction crossing the first connection portion 3. The first connection terminals 3p having the linear shape are disposed at equal intervals along the front surface of the first connection portion 3. The first connection portion 3 has a rear surface on which a reinforcing plate Rf (see FIG. 13) is stuck. Consequently, rigidity (strength) of the first connection portion 3 is increased, which ensures stability in insertion of the first connection portion 3 with respect to a first connector 7 (see FIG. 2).

Figure 5:
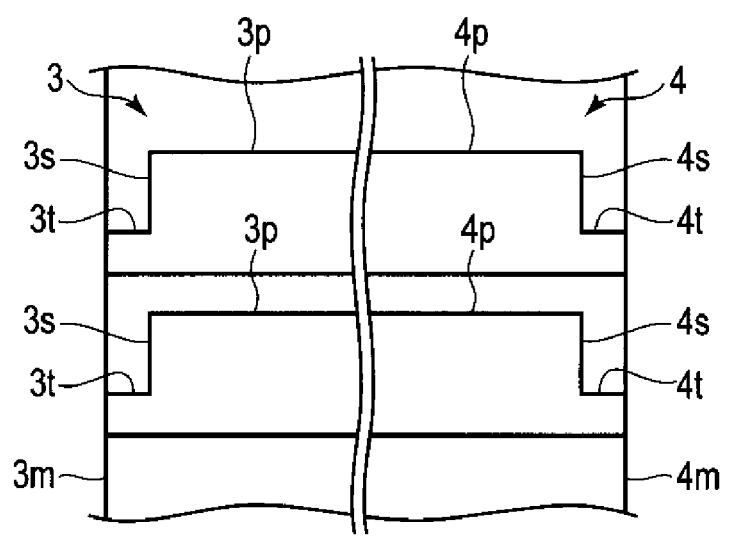
FIG. 5 is a plan view of an arrangement of plated leads, according to an embodiment of the present disclosure.

The first connection terminals 3p are subjected to electroplating, for example, gold plating or the like. Consequently, prevention of rust, prevention of generation of whiskers, reduction in connection resistance, and improvement in connection reliability are ensured. In electroplating, the first connection terminals 3p are required to be applied with a potential (voltage). Each of the first connection terminals 3p is thus provided with a first plated lead 3t (see FIG. 5, FIG. 7, and FIG. 8) including metal.

As viewed in an insertion direction in which the first connection portion 3 is inserted into the first connector 7 (see FIG. 2), the first plated lead 3t extends from the first end surface 3s of the first connection terminal 3p in the insertion direction, and an extending end of the first plated lead 3t reaches an insertion leading end 3m of the first connection portion 3. In other words, the first plated lead 3t extends from the first connection terminal 3p to the insertion leading end 3m of the first connection portion 3. The insertion leading end 3m of the first connection portion 3 is a cross section (shear plane, cutout section) that remains after the first connection portion 3 is punched with a punching tool Th in a later-described producing process (see FIG. 12). The first plated lead 3t is an example of an extending portion.

The second connection portion 4 has a front surface on which a plurality of second connection terminals 4p that each include an exposed wiring pattern are disposed. The second connection terminals 4p each include a metal material that has conductivity. In the example in FIG. 1, the second connection terminals 4p each have a linear shape extending in a direction crossing the second connection portion 4. The second connection terminals 4p having the linear shape are disposed at equal intervals along the front surface of the second connection portion 4. The second connection portion 4 has a rear surface on which a reinforcing plate Rf (see FIG. 13) is stuck. Consequently, rigidity (strength) of the second connection portion 4 is increased, which ensures stability in insertion of the second connection portion 4 with respect to a second connector 8 (see FIG. 2).

The second connection terminals 4p are subjected to electroplating, for example, gold plating or the like. Consequently, prevention of rust, prevention of generation of whiskers, reduction in connection resistance, and improvement in connection reliability are ensured. In electroplating, the second connection terminals 4p are required to be applied with a potential (voltage). Each of the second connection terminals 4p is thus provided with a second plated lead 4t (see FIG. 5 to FIG. 8) including metal.

As viewed in an insertion direction in which the second connection portion 4 is inserted into the second connector 8 (see FIG. 2), the second plated lead 4t extends from a second end surface 4s of the second connection terminal 4p in the insertion direction, and an extending end of the second plated lead 4t reaches an insertion leading end 4m of the second connection portion 4. In other words, the second plated lead 4t extends from the second connection terminal 4p to the insertion leading end 4m of the second connection portion 4. The insertion leading end 4m of the second connection portion 4 is a cross section (shear plane, cutout section) that remains after the second connection portion 4 is punched with the punching tool Th in the later-described producing process (see FIG. 12). The second plated lead 4t is an example of an extending portion.

Figure 2:
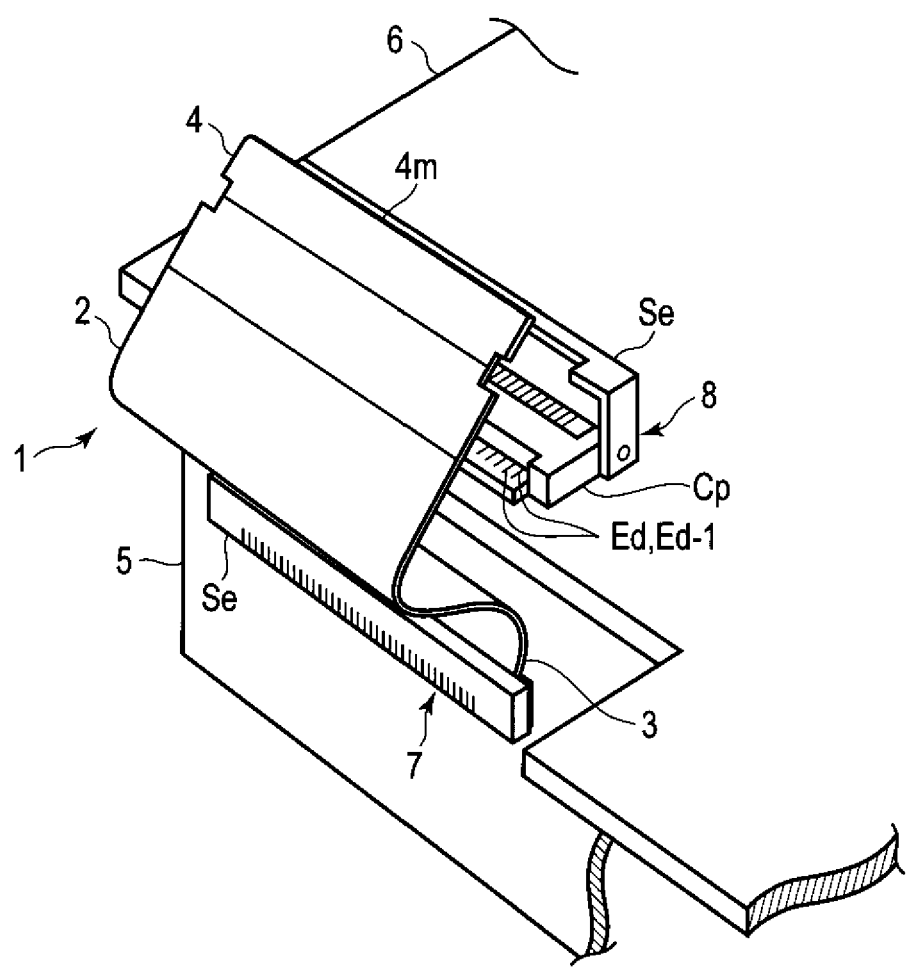
FIG. 2 is a perspective view of a state in which a connection portion of the circuit board is inserted into a connector, according to an embodiment of the present disclosure.

FIG. 2 is a schematic view of a process of connecting the FPC 1 with respect to the circuit connector (the first connector 7, the second connector 8). As illustrated in FIG. 2, the first connector 7 is mounted on a first circuit board 5 and electrically connected thereto. The first connection portion 3 of the FPC 1 is inserted into the first connector 7 and connected thereto. The second connector 8 is mounted on a second circuit board 6 and electrically connected thereto. The second connection portion 4 of the FPC 1 is inserted into the second connector 8 and connected thereto.

In the example in FIG. 2, the first connector 7 of the first circuit board 5 and the second connector 8 of the second circuit board 6 have configurations identical to each other and each include a connector body Cp, an electrode Ed, and a cover Se. The connector body Cp is molded with a resin material (for example, polyamide resin) that is more fragile than a metal material. The electrode Ed includes a metal material that has conductivity. The electrode Ed is supported by the connector body Cp. The connector body Cp is fixed to the circuit boards 5 and 6 while supporting the electrode Ed.

The electrode Ed includes a plurality of elastic terminals Ed-1. The elastic terminals Ed-1 each have a linear shape and are disposed parallel to each other with an interval therebetween. Each elastic terminal Ed-1 has a cantilever structure whose one end is supported by the electrode Ed and another end is a free end. The pitch of the elastic terminals Ed-1 is set to be identical to the pitch of the aforementioned connection terminals 3p and 4p. Consequently, when the first and second connection portions 3 and 4 of the FPC 1 are inserted into the first and second connectors 7 and 8, respectively, the connection terminals 3p and 4p and the elastic terminals Ed-1 are positioned to face each other.

In a process of inserting the first and second connection portions 3 and 4 with respect to the first and second connectors 7 and 8, for example, the first connection portion 3 is inserted into the first connector 7, and then, the cover Se is closed. Consequently, the first connection portion 3 and the first connector 7 are connected to each other. In addition, the second connection portion 4 is inserted into the second connector 8, and then, the cover Se is closed. Consequently, the second connection portion 4 and the second connector 8 are connected to each other.

Figure 3:
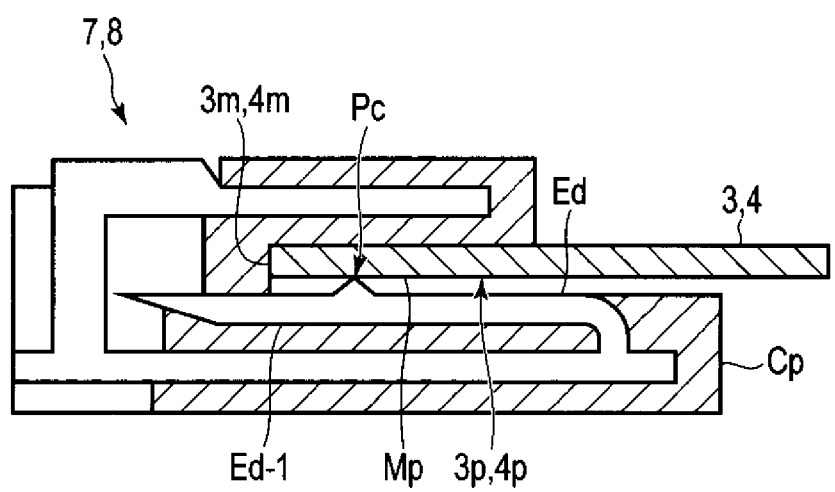
FIG. 3 is a cross-sectional view of a connector into which a connection portion is inserted, according to an embodiment of the present disclosure.

FIG. 3 is a cross-sectional view of a state in which the first and second connection portions 3 and 4 (connection terminals 3p and 4p) are electrically connected to the first and second connectors 7 and 8, respectively. As illustrated in FIG. 3, the first and second connection portions 3 and 4 are respectively inserted into the first and second connectors 7 and 8, and the cover Se (see FIG. 2) is closed. The elastic force (resilience force) of the elastic terminals Ed-1 having the cantilever structure causes the elastic terminals Ed-1 to approach the connection terminals 3p and 4p.

Each elastic terminal Ed-1 includes a contact portion Pc that protrudes at a center portion in a width direction thereof, the width direction being orthogonal to the insertion direction. The contact portion Pc has, as an example, a tapered contour shape (for example, conical shape or quadrangular pyramid shape). The contact portion Pc defines a location of electrical connection with respect to the first and second connection portions 3 and 4 (connection terminals 3p and 4p). Consequently, when the first and second connection portions 3 and 4 are respectively inserted into the first and second connectors 7 and 8, the connection terminals 3p and 4p and the contact portion Pc are electrically in contact with each other without a gap therebetween. As a result, electrical connection between the connection terminals 3p and 4p and the contact portion Pc is in a good state.

Figure 4:
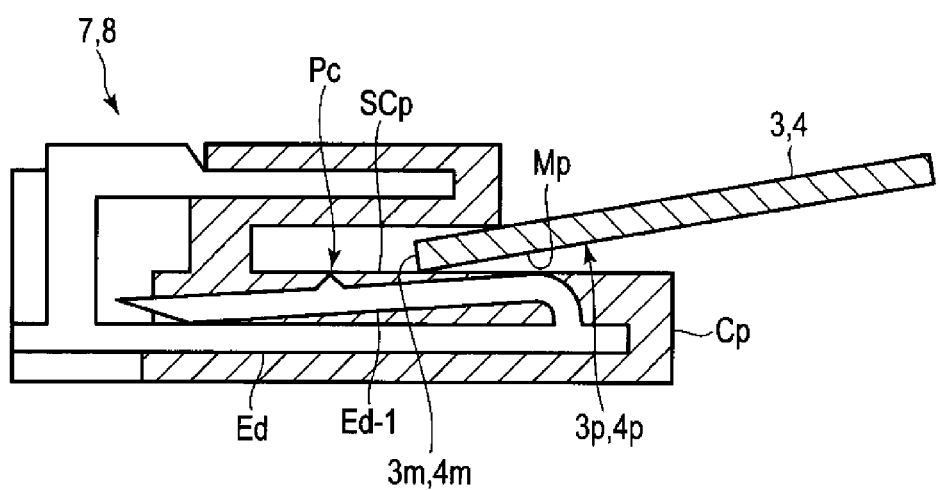
FIG. 4 is a cross-sectional view of a state in which an insertion leading end of a connection portion is in contact with a portion of a connector, according to an embodiment of the present disclosure.

FIG. 4 is a schematic view of a process of inserting the first and second connection portions 3 and 4 into the first and second connectors 7 and 8, respectively. As illustrated in FIG. 4, depending on the size of an angle of insertion of the first and second connection portions 3 and 4 with respect to the first and second connectors 7 and 8 corresponding thereto, the insertion leading end 3m of the connection portion 3 and the insertion leading end 4m of the second connection portion 4 (that is, the extending ends of the plated leads 3t and 4t including metal) come into contact with a portion SCp of the first connector 7 and a portion SCp of the second connector 8, respectively. In response to insertion motion of the first and second connection portions 3 and 4 into an inner portion of the first connector 7 and an inner portion of the second connector 8 corresponding thereto, the extending end of the first plated lead 3t and the extending end of the second plated lead 4t shave the portion SCp of the first connector 7 and the portion SCp of the second connector 8, respectively, and generate shavings. As the shavings, for example, resin power or resin pieces shaved off from the portions SCp of the connector body Cp that is more fragile than a metal material are considered.

The generated shavings are pushed into inner portions of the first and second connectors 7 and 8 in response to the insertion motion of the first and second connection portions 3 and 4 and accumulate, for example, at the contact portion Pc and the periphery thereof. Consequently, depending on the amount of the shavings that accumulate at the contact portion Pc, the connection terminals 3p and 4p and the contact portion Pc may not be electrically connected to each other, resulting in an open failure. The present embodiment thus employs an accumulation suppressing technology that causes shavings not to easily accumulate at the contact portion Pc.

FIG. 5 to FIG. 8 each illustrate a variation of the accumulation suppressing technology applied to the connection terminals 3p and 4p (first and second connection portions 3 and 4). In the example in FIG. 5, the first plated lead 3t of each of the connection terminals 3p and the second plated lead 4t of each of the connection terminals 4p are disposed on one side in the width direction of the connection terminals 3p and 4p, respectively. In the example in FIG. 6, the plated leads 3t of the connection terminals 3p are removed to leave only the first end surfaces 3s, and the plated leads 4t of the connection terminals 4p are disposed to be on one side in the width direction. In other words, in the examples in FIG. 5 and FIG. 6, the plated leads 3t and 4t are disposed on an identical side in the width direction. The width direction is defined as the aforementioned direction orthogonal to the insertion direction.

Figure 6:
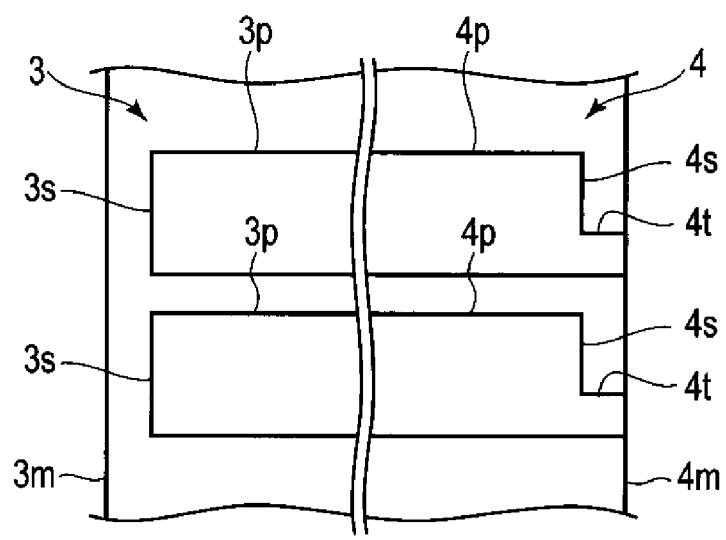
FIG. 6 is a plan view of another arrangement of plated leads, according to an embodiment of the present disclosure.
Figure 7:
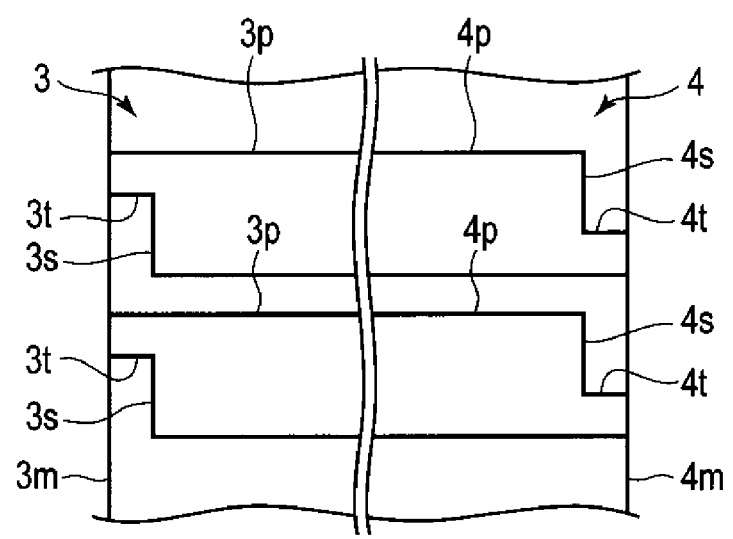
FIG. 7 is a plan view of another arrangement of plated leads, according to an embodiment of the present disclosure.
Figure 8:
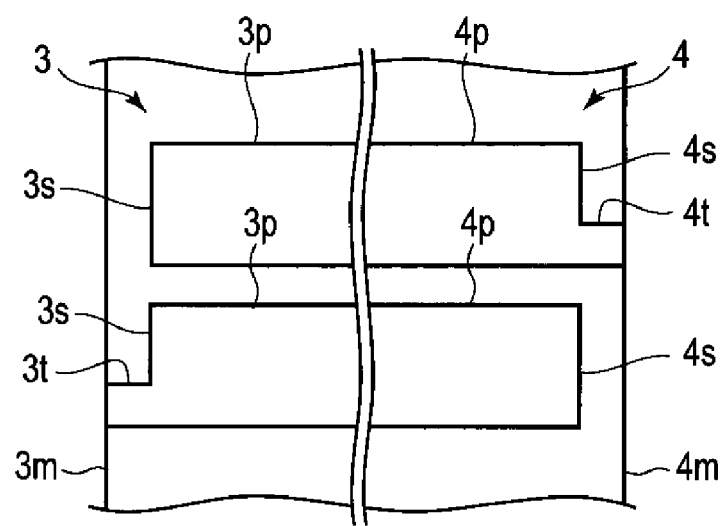
FIG. 8 is a plan view of another arrangement of plated leads, according to an embodiment of the present disclosure.

In the example in FIG. 7, the first plated lead 3t of each of the connection terminals 3p and the second plated lead 4t of each of the connection terminals 4p are disposed on different sides in the width direction. The example in FIG. 8 is a combination of the aforementioned FIG. 5 and FIG. 6. In other words, the first plated lead 3t of one of two adjacent connection terminals 3p of the first connection portion 3 is removed to leave only the first end surface 3s, and the first plated lead 3t of the other one of the two adjacent connection terminals 3p is disposed on one side in the width direction. In addition, the second plated lead 4t of one of two adjacent connection terminals 4p of the second connection portion 4 is disposed on one side in the width direction, and the second plated lead 4t of the other one of the two adjacent connection terminals 4p is removed to leave only the second end surface 4s.

Figure 9:
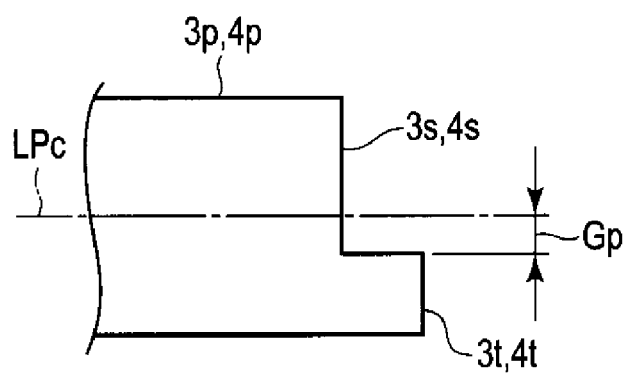
FIG. 9 is a plan view of an arrangement of plated leads that avoid a contact portion, according to an embodiment of the present disclosure.
Figure 10:
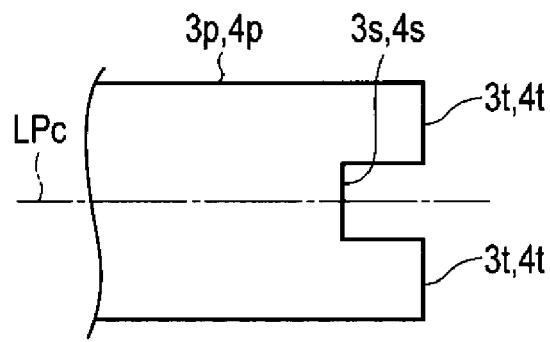
FIG. 10 is a plan view of another arrangement of plated leads that avoid a contact portion, according to an embodiment of the present disclosure.

FIG. 9 and FIG. 10 are schematic views each defining a positional relationship between the plated leads 3t and 4t and the aforementioned contact portion Pc. In FIG. 9 and FIG. 10, a dash-dotted line LPc is a virtual line that passes through the contact portion Pc (the aforementioned location of electrical connection) and extends in the insertion direction. In other words, the virtual line LPc extends in an insertion direction in which the first connection portion 3 is inserted into the first connector 7 (see FIG. 2). In this case, the plated leads 3t and 4t are disposed on one side at a location that avoids the virtual line LPc (in other words, a location off the virtual line LPc).

In the example in FIG. 9, the plated leads 3t and 4t are disposed on one side of the virtual line LPc so as to avoid the virtual line LPc. In the example in FIG. 10, the plated leads 3t and 4t are disposed on both sides of the virtual line LPc so as to avoid the virtual line LPc. In both cases, a gap Gp between the virtual line LPc and the plated leads 3*t* and 4*t* may be preferably as large as possible.

Figure 11:
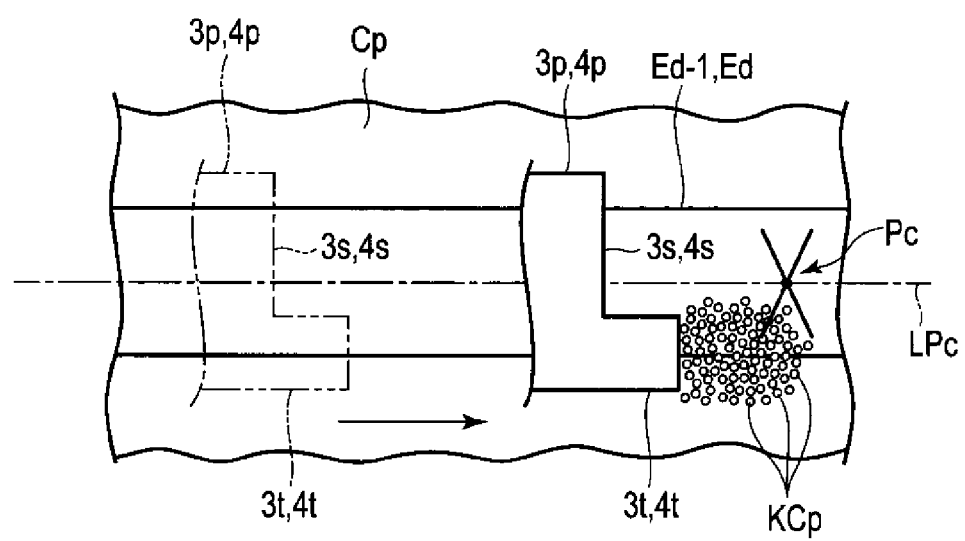
FIG. 11 is a plan view schematically illustrating a state in which shavings accumulate at the periphery of a contact portion, according to an embodiment of the present disclosure.

According to the FPC 1 (circuit board) of the present embodiment, the plated leads 3*t* and 4*t* are each disposed on one side at a location that avoids the virtual line LPc (see FIG. 5 to FIG. 10). Consequently, it is possible to cause shavings KCp (see FIG. 11) not to easily accumulate at the contact portion Pc. For example, as illustrated in FIG. 11, the shavings KCp are generated as a result of the extending ends of the plated leads 3*t* and 4*t* shaving the portions SCp of the first and second connectors 7 and 8 during insertion of the first and second connection portions 3 and 4 with respect to the first and second connectors 7 and 8. The generated shavings KCp are caused not to easily concentrate at the contact portion Pc while being pushed into inner portions of the first and second connectors 7 and 8 in response to the insertion motion of the first and second connection portions 3 and 4, and accumulate at the periphery of the contact portion Pc by avoiding the contact portion Pc. As a result, it is possible to make zero or greatly reduce the amount of the shavings KCp interposed between the connection terminals 3*p* and 4*p* and the contact portion Pc. Thus, it is possible to suppress electrical connection between the connection terminals 3*p* and 4*p* and the contact portion Pc from becoming poor.

According to the FPC 1 (circuit board) of the present embodiment, it is possible to remove one of the plated leads 3*t* and 4*t* (see FIG. 6 and FIG. 8). Consequently, at one end where the first plated lead 3*t* or the second plated lead 4*t* is removed, the first end surface 3*s* of the connection terminal 3*p* or the second end surface 4*s* of the connection terminal 4*p* ends before reaching the insertion leading end 3*m* of the connection portion 3 or the insertion leading end 4*m* of the second connection portion 4. In this case, the connection terminal 3*p* or 4*p* including metal does not come into contact with the portion SCp (for example, a fragile portion) of the first connector 7 or the second connector 8. As a result, generation of the shavings KCp can be completely eliminated.

Figure 12:
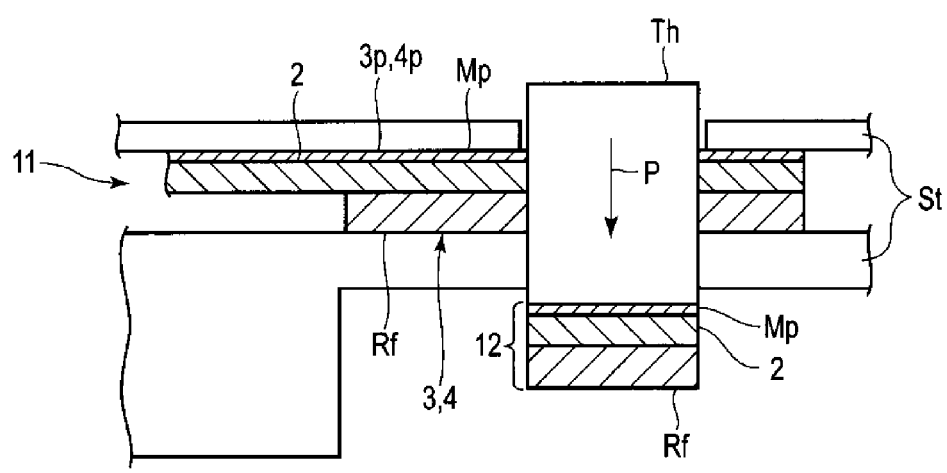
FIG. 12 is a cross-sectional view schematically illustrating a state in which a connection portion of a circuit board is subjected to punching, according to an embodiment of the present disclosure.

FIG. 12 is a schematic view of a producing apparatus for producing the FPC 1. The producing apparatus of the present embodiment includes the punching tool Th (also referred to as a punch) that punches the first and second connection portions 3 and 4 in a final stage of the producing process of the FPC 1, and a punching structure St. A FPC sheet 11 including a plurality of the FPCs 1 (see FIG. 1) connected together is set at the producing apparatus. An unnecessary portion 12 is punched out from the set FPC sheet 11. Consequently, the first and second connection portions 3 and 4 of the FPC 1 are formed at a portion that remains after the unnecessary portion 12 is punched out. An example of the producing process will be described below.

The FPC 1 includes a plated portion Mp laminated on a front surface of the board body 2 and the reinforcing plate Rf stuck on a rear surface of the board body 2. The plated portion Mp includes the connection terminals 3*p* and 4*p* and the plated leads 3*t* and 4*t*. The FPC sheet 11 including a plurality of the FPCs 1 is set at the punching structure St.

In this state, the punching tool Th is caused to move from an outer side of the plated portion Mp in an arrow P direction. At this time, the first and second connection portions 3 and 4 of each of the FPCs 1 are punched from the side of the plated portion Mp (that is, the front surface side of the board body 2). Consequently, the FPCs 1 that each include the first and second connection portions 3 and 4 each having a contour illustrated in FIG. 1 are produced.

Figure 13:
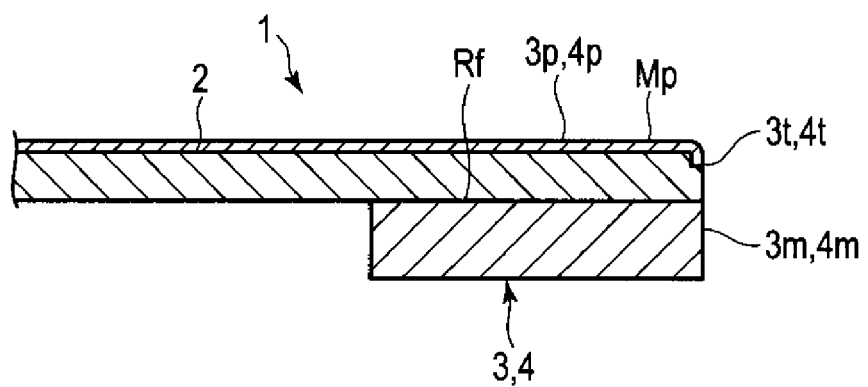
FIG. 13 is a cross-sectional view of a shape of an insertion leading end of a plated lead, according to an embodiment of the present disclosure.

FIG. 13 is a cross-sectional view around the first and second connection portions 3 and 4 of the FPC 1 produced with the producing apparatus of the present embodiment. As illustrated in FIG. 13, the insertion leading end 3*m* of the connection portion 3 and the insertion leading end 4*m* of the second connection portion 4 are cross sections (shear planes, cutout sections) that remain after the connection portion 3 and the second connection portion 4 (FPC 1) are punched from the front surface side of the board body 2 with the punching tool Th.

According to the producing method of the present embodiment, each of the extending ends of the plated leads 3*t* and 4*t* that respectively reach the insertion leading end 3*m* of the connection portion 3 and the insertion leading end 4*m* of the second connection portion and 4 has a shape that curves toward the board body 2. Consequently, it is possible, when the extending ends of the plated leads 3*t* and 4*t* come into contact with the portions SCp of the first and second connectors 7 and 8 (connector body Cp), to reduce a friction force (frictional resistance) generated due to the contact. As a result, it is possible to greatly reduce the generation amount of the shavings KCp.

Consequently, due to a synergistic effect together with the aforementioned features (that is, the feature in which the plated leads 3*t* and 4*t* are each disposed on one side at a location that avoids the virtual line LPc) of the FPC 1 (circuit board), it is possible to greatly reduce the amount of the shavings KCp that are pushed into the contact portion Pc and the periphery thereof. If the first and second connection portions 3 and 4 are punched from a side opposite to the side of the plated portion Mp (that is, the rear surface side of the board body 2) in a direction opposite to the arrow P direction, each of the extending ends of the plated leads 3*t* and 4*t* has a rising (standing upright) contour shape. Thus, compared with the producing method of the present embodiment, it is not possible to reduce the friction force. However, even when the first and second connection portions 3 and 4 are punched from the side opposite to the side of the plated portion Mp, the plated leads 3*t* and 4*t* that are each disposed on one side at a location that avoids the virtual line LPc enable a certain effect to be exerted with respect to suppressing the amount of the shavings KCp interposed between the connection terminals 3*p* and 4*p* and the contact portion Pc. Consequently, it is possible to suppress electrical connection between the connection terminals 3*p* and 4*p* and the contact portion Pc from becoming poor.

The FPC 1 (circuit board) of the present disclosure is applicable to various electronic apparatus. As a specific example, the FPC 1 is applicable to, for example, various imaging apparatuses, such as a stereo camera, a monocular camera, and the like. As an example, if a case in which the FPC 1 (circuit board) is applied to a stereo camera is considered, the stereo camera includes, as illustrated for example in FIG. 2, the first circuit board 5 and the second circuit board 6. The first circuit board 5 includes an imaging element that is mounted thereon together with the first connector 7. The second circuit board 6 includes a control circuit that is provided thereon together with the second connector 8 and that is configured to control the imaging element.

In this case, the first connection portion 3 of the FPC 1 is inserted into the first connector 7. In addition, the second connection portion 4 of the FPC 1 is inserted into the second connector 8. At this time, depending on an angle of insertion of the first and second connection portions 3 and 4 with respect to the first and second connectors 7 and 8, the aforementioned extending ends of the plated leads 3*t* and 4*t* shave portions of the first and second connectors 7 and 8, which generates shavings. The savings are pushed into an inner portion of the first and second connectors 7 and 8 in response to an insertion motion of the first and second connection portions 3 and 4.

The plated leads 3t and 4t are each disposed on one side at the aforementioned location that avoids the virtual line LPc. It is thus possible to cause the shavings KCp (see FIG. 11) not to easily accumulate at the contact portion Pc. For example, it is possible to cause the shavings KCp to accumulate at the periphery of the contact portion Pc by avoiding the contact portion Pc. Consequently, it is possible to cause the electrical connection between the connection terminals 3p and 4p of the FPC 1 and the contact portion Pc to be in a good condition. Control with respect to the imaging element is thus made to be stable, resulting in good accuracy in imaging a three-dimensional (solid) image.

In addition, in the aforementioned embodiment, a case in which the connection terminals 3p and 4p are subjected to electroplating is considered as an application range of the present disclosure. However, no limitation is indicated thereby. For example, when an extending portion including metal is present at each of the connection terminals 3p and 4p that are subjected to electroless plating, the same effect can be exerted by providing the extending portions with the same configuration as that in the aforementioned embodiment.

Numerous additional modifications and variations are possible in light of the above teachings. It is therefore to be understood that within the scope of the appended claims, the disclosure of the present disclosure may be practiced otherwise than as specifically described herein. For example, elements and/or features of different illustrative embodiments may be combined with each other and/or substituted for each other within the scope of this disclosure and appended claims.

The present disclosure can be implemented in any convenient form, for example using dedicated hardware, or a mixture of dedicated hardware and software. The present disclosure may be implemented as computer software implemented by one or more networked processing apparatuses. The processing apparatuses can compromise any suitably programmed apparatuses such as a general purpose computer, personal digital assistant, mobile telephone (such as a WAP or 3G-compliant phone) and so on. Since the present disclosure can be implemented as software, each and every aspect of the present disclosure thus encompasses computer software implementable on a programmable device. The computer software can be provided to the programmable device using any conventional carrier medium (carrier means). The carrier medium can compromise a transient carrier medium such as an electrical, optical, microwave, acoustic or radio frequency signal carrying the computer code. An example of such a transient medium is a TCP/IP signal carrying computer code over an IP network, such as the Internet. The carrier medium can also comprise a storage medium for storing processor readable code such as a floppy disk, hard disk, CD ROM, magnetic tape device or solid state memory device.

This patent application is based on and claims priority pursuant to 35 U.S.C. § 119(a) to Japanese Patent Application No. 2018-225441, filed on Nov. 30, 2018, in the Japan Patent Office, the entire disclosure of which is hereby incorporated by reference herein.

REFERENCE SINGS LIST

1 FPC (an example of a circuit board)
2 Board body
3 First connection portion
4 Second connection portion
5 First circuit board
6 Second circuit board
7 First connector
8 Second connector
Cp Connector body
Ed Electrode
Ed-1 Elastic terminal
Pc Contact portion
3P First connection terminals
4P Second connection terminals
3t First plated lead (an example of an extending portion)
4t Second plated lead (an example of an extending portion)
3s First end surface
4s Second end surface
3m Insertion leading end of first connection portion
4m Insertion leading end of second connection portion

The invention claimed is:

1. A circuit board, comprising:
a board body; and
a pair of connection portions disposed at both ends of the board body, each of the pair of connection portions being inserted into a connector,
wherein each of the pair of connection portions includes a connection terminal electrically connected to the connector,
at least one of the pair of connection portions includes an extending portion extending from the connection terminal to an insertion leading end of the at least one of the pair of connection portion, the extending portion being a plated lead including metal,
the extending portion is disposed at a position to avoid a virtual line extending in an insertion direction through a position where the connector and the connection terminal are electrically connected, and
the at least one of the pair of connection portions includes the extending portion that extends from the connection terminal to the insertion leading end of the at least one of the pair of connection portions.

2. The circuit board according to claim 1, wherein the extending portion is disposed on one side of the connection terminal in a width direction orthogonal to the insertion direction.

3. The circuit board according to claim 1, wherein the extending portion includes an extending end that reaches the insertion leading end of the at least one of the pair of connection portions, the extending end having a shape that curves toward the board body.

4. A method for producing the circuit board according to claim 1,
the board body including a plurality of board bodies each including a plated portion laminated on a front surface of the board body and a reinforcing plate stuck on a rear surface of the board body, the method comprising:
setting a sheet at a punching structure, the sheet including the plurality of board bodies connected together; and
punching, from a side of the plated portion, an unnecessary portion adjacent to at least one of the pair of connection portions.

5. An imaging apparatus comprising the circuit board according to claim 1.

* * * * *